United States Patent [19]

Zaugg

[11] 4,433,295

[45] Feb. 21, 1984

[54] PROCESS AND APPARATUS FOR DETERMINING THE STATE OF CHARGE OF A BATTERY

[75] Inventor: Edmond Zaugg, Petit-Lancy, Switzerland

[73] Assignee: Montres Rolex S.A., Switzerland

[21] Appl. No.: 338,153

[22] Filed: Jan. 8, 1982

Related U.S. Application Data

[63] Continuation-in-part of Ser. No. 337,105, Jan. 5, 1982, abandoned.

[30] Foreign Application Priority Data

Jan. 5, 1981 [CH] Switzerland .................. 13/81

[51] Int. Cl.³ .......................................... G01N 27/46
[52] U.S. Cl. ........................................ 324/429; 320/48
[58] Field of Search ............... 324/425, 426, 427, 429, 324/430, 433; 320/48

[56] References Cited

U.S. PATENT DOCUMENTS

| | | | |
|---|---|---|---|
| 3,899,732 | 8/1975 | Staby | 324/429 |
| 3,970,933 | 7/1976 | Hamaguchi | 324/429 |
| 4,080,560 | 3/1978 | Abert | 324/429 |
| 4,352,067 | 9/1982 | Ottone | 324/429 |

Primary Examiner—Michael J. Tokar
Attorney, Agent, or Firm—Ostrolenk, Faber, Gerb & Soffen

[57] ABSTRACT

A process and apparatus for determining the state of discharge of an electric battery by measuring the voltage drop associated with changes in its internal resistance. According to the process, the battery is periodically connected to a reference load for a brief interval during which the voltage at the terminals of the load is measured. The measured analog voltage is converted to a digital signal which is compared to a number of preprogrammed digital levels to determine the state of change of the battery. The apparatus comprises a commutation component controlled by a logic signal, a reference load, a sampler-and-hold circuit, an analog-to-digital converter and a comparator which can be programmed at n levels. The apparatus compares digital signals corresponding to the voltage at the terminals of the reference load with the n programmed levels of the decoder and a signal is generated indicating the level of the electric battery with respect to the levels programmed into the comparator.

22 Claims, 3 Drawing Figures

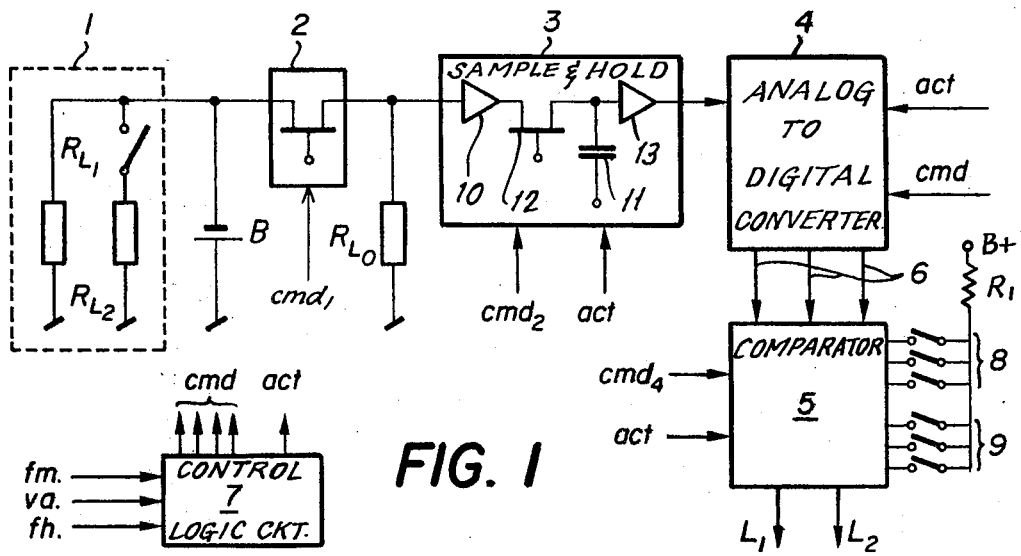
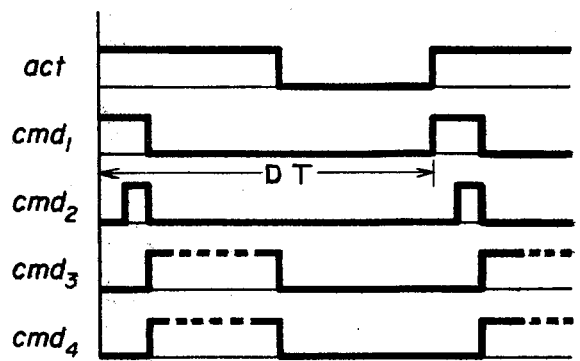
FIG. 1
FIG. 2
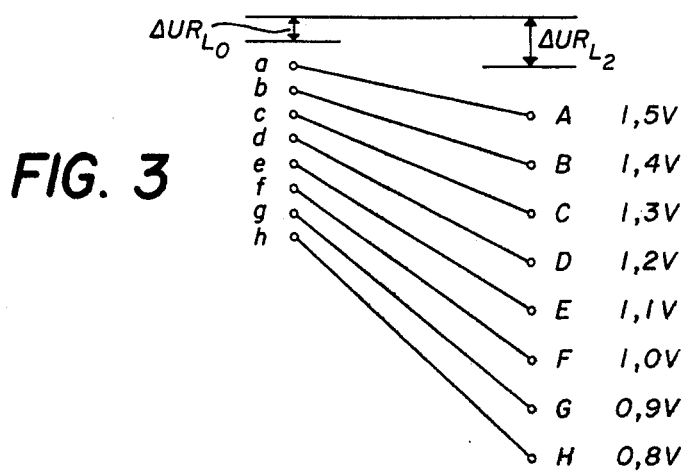
FIG. 3

PROCESS AND APPARATUS FOR DETERMINING THE STATE OF CHARGE OF A BATTERY

CROSS REFERENCE TO RELATED APPLICATION

This is a continuation-in-part of application Ser. No. 337,105 filed Jan. 5, 1982, now abandoned.

TECHNICAL FIELD

This invention concerns a process or procedure for determining the state of charge of an electric battery used as a power source for an instrument comprising a current consuming component, such as, for example, an electronic watch. It also concerns an apparatus for putting this process into practice.

BACKGROUND OF THE INVENTION

A battery is an electrochemical element, with an internal resistance that increases greatly as soon as its capacity is nearly exhausted. This exhaustion can be caused by normal discharge when current is supplied to a current consuming component as well as by self-discharge during non-use or storage, or by a combination of these effects.

Most electronic instruments, and, in particular, electronic watches, have two power consumption states which may be recurrent or not, corresponding to the states defined as minimum current and high current. Generally, the instrument fails when making the transition to high current operation. It is at such times that, if the internal resistance of the battery has increased, the drop in voltage is sufficient to disrupt the operation of the current consuming component.

In, for example, an analog watch, the high current state is recurrent. At each second, the current drawn by the motor, added to that continuously drawn by the electronic circuit, causes a drop in the voltage which may disrupt the operation of the motor or the electronic circuit. It is thus wise to continually detect the dicharge state of the electric battery. Prior to the present invention, there was no reliable procedure or apparatus for determining with certainty the state of an electric battery of a precision instrument which was adaptable to conform to a variety of externally selectable parameters.

SUMMARY OF THE INVENTION

The present invention solves this problem by providing a process for determining the state of discharge of a battery by periodically measuring and sampling the output voltage of the battery, while it is briefly connected to a reference load, converting the sampled voltage to digital form, comparing the resulting digital signals with at least one digital level which can be programmed into a decoder or comparator and generating an output signal indicating that the discharge state of the battery corresponds to at least one programmed level. Advantageously, these operations are performed during time intervals when the current consuming component is drawing minimum current.

The apparatus which may be used to implement this process comprises a switching device for connecting a reference load to the battery. It also includes a sample-and-hold circuit for providing voltage measurement samples at the terminals of the reference load each time the switching device is activated by the logic signal. An analog-to-digital converter is provided to transform the sampled analog voltage level into a digital signal. A decoder or comparator component can be programmed to at least one level, the decoder being adapted to compare the digital signals corresponding to the analog voltage level to the levels of the comparator. The comparator component is adapted to supply at least one signal indicating the state of the battery, this signal being generated by the correspondence of one of the digital signals with one of the levels selected in the comparator. A logic control unit may be used to provide appropriate timing and logic signals to activate the above components at the proper times.

The apparatus of this invention can be used in any application where it is important to monitor the state of an electric battery, such as, for example, in watches, medical instruments, underwater chronometers, detectors, transmission equipment, etc. The principle of the process and the apparatus according to the invention consists in periodically measuring the voltage of the battery under predetermined load condition and in transmitting the measurements so obtained to a circuit programmed for supplying a number of signals corresponding to the successive discharge states of the battery. In practice, for a watch, two distinctive signals are useful: a first signal corresponding to a pre-alarm level and a second signal corresponding to an alarm level.

The internal resistance of a battery which determines the voltage output under load, increases as temperature is lowered. In the case of a watch, generally the device has no inputs which supply information as to the causes of the increase of the internal resistance. Advantageously, the programming of two detection levels allows a pre-alarm to be set off, even if only temporarily, when the watch undergoes a decrease of temperature, thus indicating, in advance, that the battery is nearly exhausted or not performing properly due to an increase in internal resistance which exceeds permissible variations and which, by lowering battery output voltage, may cause the instrument to stop operating.

The apparatus of the present invention therefore comprises programming means which ensures the selection and fitting of appropriate detection levels by allowing fine adjustment of a predetermined number of detection levels.

BRIEF DESCRIPTION OF THE DRAWINGS

For the purpose of illustrating the invention, there is shown in the drawings an embodiment which is presently preferred, it being understood, however, that the invention is not limited to the precise arrangements and instrumentalities shown.

FIG. 1 is a block diagram of an apparatus according to the invention;

FIG. 2 is a timing diagram of the apparatus of FIG. 1; and

FIG. 3 represents schematically the correspondence of the levels of the comparator with the different states of the battery.

DETAILED DESCRIPTION OF THE DRAWINGS

With reference to FIG. 1, the apparatus shown is intended to determine the state of discharge of a battery B of an instrument with a current consuming component. The instrument is schematically represented by block 1 and comprises a load $R_{L1}$ representing the state defined as minimum current and an intermittent load $R_{L2}$, representing the state defined as high current where power consumption is at its maximum. The apparatus according to the invention includes a switching device 2, a reference load or resistance $R_{L0}$, a sample-and-hold circuit 3 of a type well known in the art, an analog-to-digital converter 4 and a decoder or comparator 5 which can be programmed at n levels which, in the embodiment shown, is connected to the converter 4 by three lines 6. The embodiment shown also includes a control logic circuit 7, which can be independent of the current consuming component or at least partially integrated with the latter, in which case all or part of the logic signals necessary for the functioning of the device can be supplied by the circuits of the current consuming components. The control logic circuit 7 has at least three inputs: "fm" for providing a measurement frequency (corresponding to the periodicity of the measure samplings, for example, every hour, every minute, etc.); "va" for providing inhibit signals intended, for example, to prohibit measurement during certain periods; and "fh" for providing a clock frequency used as a reference, defining the time during which the apparatus performs the measurement. This reference frequency is preferably the highest frequency available in the circuits of the instrument.

The control logic circuit 7, the sample-and-hold circuit 3, the analog-to-digital converter 4 and the comparator 5 are basic circuits well known in the art which must be adapted to perform the functions in their particular environment depending, for example, on whether the circuits must perform statically or dynamically.

The reference load $R_{L0}$ is preferably comprised of at least one resistance or of a diode-resistance combination. It may be comprised of temperature variable resistances or of a combination of resistances and/or temperature variable diodes to allow compensation of temperature variations, or to obtain a variation of the detection function of the levels as temperature varies.

In the embodiment illustrated in FIG. 1, the comparator 5 has associated with it two groups of switches 8 and 9 which select two detection levels of the state of discharge of the battery B, the switches being tied to a pull-up resistor $R_1$ and thus providing a logic one input bit to comparator 5 if closed and a logic zero if open. These switches define two predetermined or programmable digital signal levels which provide inputs to comparator 5. The digital signal on lines 6 from analog-to-digital converter 4 are compared to theses inputs to generate two corresponding output signals $L_1$ and $L_2$ which may define, respectively, a pre-alarm level and an alarm level. In FIG. 1, the two groups each comprise three switches which constitute programming components, each switch of each group having an input on each respective line. The number of lines and, consequently, the number of programming components can be adapted as necessary. Similarly, the number of detection levels (e.g. pre-alarm and alarm) and, consequently, the number of outputs can be greater than two or in some cases only one. In practice, the number p of these outputs is less than or equal to the number n of the levels of the comparator which can be programmed.

According to another variation (now shown) the comparator can have a series of switches for directly selecting p levels of outputs, p being as nearly equal as possible to n. The number p can be equal to two and the outputs can again correspond to a pre-alarm and alarm level.

The operating sequence of the device may be outlined with reference to FIGS. 1 and 2. Periodically the residual voltage of battery B is briefly measured when it is momentarily connected to the reference load $R_{L0}$ (when switching device 2 is turned on) in addition to load $R_{L1}$ (when the battery is delivering only the minimum current). The voltage, which appears at the terminals of the reference load, is sampled and held by the sample-and-hold circuit 3. This measurement is then transformed into digital information by the analog-to-digital converter 4. The comparator 5 comprises n programming means (for example, in the form of groups of switches 8, 9) which are programmed prior to the measurement to compare the signal which appears on the output lines G of the converter 4 to the n levels. The number n of the groups of switches corresponds to the number of detection levels of the state of the battery. These n levels may be used to generate p output signals which activate p indicators or information feedback circuits acting on the current consuming component 1 in order to modify its operation for energy saving reasons, or for ensuring more reliable operation under increased internal resistance of battery B.

For a watch, the n levels of detection of the comparator can, for example, be obtained by eight voltage values in increments of 0.1 volts from 0.8 to 1.5 volts. The state of the battery in terms of these eight levels are transmitted to the comparator 5 by three parallel bits on lines 6 which may represent eight pieces of information. The two groups 8 and 9 of three switches each allow the programming of a corresponding level, in the case of a watch, one at the pre-alarm level and the other at the alarm level. When the digital bits on lines 6 are such as to indicate that the battery voltage has fallen below the programmed levels, appropriate output signals appear on output lines $L_1$ and $L_2$.

The control logic circuit 7 transmits, to the different elements constituting the apparatus described, control signals $cmd_1$, $cmd_2$, $cmd_3$ and $cmd_4$. It also provides an activation signal act which is produced during measurement periods in order to save energy in response to an input pulse fm. The length of the activation signal act may be controlled by a monostable multivibrator activated by the fm signal or by a suitable counter counting the output pulses of a clock. The effect of the fm pulse may be delayed if desired by providing a va input pulse to control logic circuit 7.

The "fh" input provides a clock frequency defining the duration of the act signal. This duration must be long enough to permit the device to carry out the measurement.

All of these signals are represented by arrows on FIG. 1. The control signals and activation signal are shown in the timing diagram of FIG. 2 and cause testing circuit to sample the state of the battery once every time interval DT (e.g., once every hour).

During operation, signal $cmd_1$ is first supplied to switching device 2, preferably at times when load $R_{L2}$ is not connected to battery B, (this is ensured by prohibit signal va) to connecte reference load $R_{L0}$ to battery B. This occurs at the time during which $cmd_1$ is at the logic one level. During the later part of the time interval defined by $cmd_1$, a positive pulse $cmd_2$ is provided to sample-and-hold circuit 3 to cause sample-and-hold circuit 3 to sample the applied voltage. This operation may be performed by allowing the voltage across $R_{L0}$, which is buffered by a voltage follower 10, to appear across a capacitor 11 due to the closing of switch 12 on application of the pulses of signal cmd₂. When signal cmd₂ again goes to the logic zero level, the voltage generated by the battery which appeared across $R_{L0}$ is maintained on capacitor 11 and applied to the input of high impedance voltage follower 13. Signal cmd₃ then causes this analog voltage to be converted to digital form by analog-to-digital converter 4. The positive pulse of activation signal act then serves to strobe the converted signal to output line 6 of analog-to-digital converter 4.

The positive pulse of signal cmd₄ is applied to comparator 5 causing it to compare the signal supplied on line 6 to the programmed levels provided by switch groups 8 and 9. When this comparison is complete, the activation signal act which has been applied to comparator 5 strobes the appropriate output line if the signal on line 6 corresponds to one of the pre-programmed inputs to comparator 5. After conversion and strobing to output are complete, the activation signal act makes a transition to logic the zero level causing capacitor 11 to discharge in preparation for the next sampling operation.

While these operations occupy a significant percentage of the time between operation cycles in FIG. 2, it should be recognized that the time between measurements may be quite large as compared to the actual time to perform the indicated operations as discussed below.

FIG. 3 represents schematically a comparison between the voltage drops associated with the reference levels of the programmed comparator 5 and the states of the battery, in the case where the reference load draws a current equal to half the load $R_{L2}$. The programmed levels of the decoder are represented by points a, b ... h, while A, B ... H represent the states of actual discharge of the battery when load $R_{L2}$ is connected to it. By virtue of the programming components or switches associated with the decoder, the correspondence function can be modified, thus assuring a great deal of flexibility when using the apparatus. In fact, it is possible to program several information levels, and, even to modify them according to a subsequent modification of the load. There is an advantage in providing n levels which cover a larger volume range than the anticipated operating range. Such provision opens up the possibility of adjusting the system according to characteristic current consumption of the analog elements of the system preferably during manufacturing. Moreover, due to this broadening of the range, errors due to leakage characteristics of the system can be compensated, for example, by the displacement of one level during the programming of the decoder.

An advantage of the apparatus of the invention is that the sampling is carried out with the battery connected to a predetermined fixed load. Such a measurement is easier and more reproducible than that carried out on the actual current consuming load which can vary periodically (for example when changing the day on a watch). Furthermore, the measurement system, which samples only during a few milliseconds or a fraction of a millisecond each minute or each hour, has the advantage of using only a negligible portion of the total charge of the battery. In addition, the entire device need only be activated during the measuring and digital interpretation period and can be disconnected between measures. Finally, although the control logic is adjusted to activate the device periodically, it may be designed for momentarily prohibiting the measurement during special temporary functioning of the current consuming component, for example, accelerated forward movement of the watch motor, changing the day, etc.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. A process for determining the state of charge of a battery supplying electrical power to an instrument of the type which includes a current consuming component having at least two consumption levels, one of said levels being a minimum current consumption level defined as a minimum load and a second of said levels being a maximum consumption level defined is a maximum load, said process comprising the steps of:
   (a) monitoring the load condition of said current consuming component to determine if it presents said minimum or said maximum load to said battery;
   (b) periodically connecting said battery to a reference load but only when said current consuming components presents said minimum load to said battery;
   (c) sampling the voltage across said reference load when said battery is connected to said reference load;
   (d) comparing the sampled voltage to a number of predetermined voltage levels each which correspond to a different state of charge of the battery so as to determine the state of charge of the battery; and
   (e) generating at least one output signal which indicates a state of charge of the battery as determined by said comparing step.

2. The process of claim 1 in which the sampled voltage is converted to a digital signal and the digital signal is compared to a number of predetermined digital signals which correspond to said predetermined voltage levels.

3. The process of claim 1 in which the sampled voltage is converted to a digital signal by the process of:
   (a) sampling and storing in analog form a voltage signal generated when said battery is applied to said reference load; and
   (b) converting the stored voltage to a digital signal using an analog-to-digital converter.

4. The process of claim 3 in which said reference load is selected to draw a current such that said current drawn from said battery by said reference load and said minimum load is approximately equal said current drawn by the maximum load.

5. An apparatus determining the state of charge of a battery supplying electrical power to an instrument of the type which includes a current consuming component having at least two consumption levels, one of said levels being a minimum current consumption level defined as a minimum load and a second of said levels being a maximum consumption level defined as a maximum load, the apparatus comprising:
   (a) means for monitoring the load condition of said current consuming component to determine if it presents said minimum or said maximum load to said battery;
   (b) means for periodically connecting said battery to a reference load but only when said current consuming component presents said minimum load to said battery;

(c) means for sampling the voltage across said reference load when said battery is connected to said reference load;

(d) means for comparing said sampled voltage to a number of predetermined voltage levels each of which correspond to a different state of charge of said battery so as to determine the state of charge of said battery; and (e) means for generating at least one output signal which indicates the state of charge of said battery as determined by said comparing step.

6. The apparatus of claim 5 further comprising means for converting said sampled voltage to a digital signal and means for providing a number of programmed digital signal to which said digital signal is compared.

7. The apparatus of claim 6 in which the means for converting the sampled voltage to digital form comprises:

(a) means for sampling and storing in analog form the voltage generated by the battery; and (b) an analog-to-digital converter for converting said sampled voltage to digital form.

8. The apparatus of any one of claims 5 through 7 in which the reference load is selected to draw a current such that said current drawn from the battery by said reference load and said minimum load is approximately equal said current drawn by said maximum level.

9. The apparatus of any one of claims 6 or 7 further comprising at least one group of switches which may be used to program one of said predetermined digital signals.

10. The apparatus of any one of claims 6 or 7 further comprising:

(a) several groups of switches, each said group being used to program one of said predetermined digital signals; and (b) means for generating a number of said output signals, the number of said output signals being equal to or less than the number of said predetermined digital signals.

11. The apparatus of any one of claims 6 or 7 comprising two groups of switches, one of said groups being used to program a pre-alarm level and the other being used to program an alarm level.

12. The apparatus of any one of claims 5 through 7 further comprising a control logic component adapted to supply at least one control logic signal to the means for periodically connecting the battery to the reference load.

13. The apparatus of claim 12 in which the control logic component activates said apparatus at predetermined instances unless said current consuming component presents said maximum load to said battery at that instance.

14. The apparatus of claim 12 in which the control logic prohibits said apparatus from being activated any time during which said current consuming component presents a load greater than minimum load.

15. The apparatus of claim 12 in which the control logis logic prohibits the apparatus from being activated any time during which the current consuming component presents a maximum load.

16. The apparatus of any one of claims 5 through 7 in which said reference load comprises at least one resistance.

17. The apparatus of any one of claims 5 through 7 in which said reference load comprises at least one diode and at least one resistance.

18. The apparatus of any one of claims 5 through 7 in which said reference load comprises at least one element having a resistance value which varies with temperature in a predetermined fashion.

19. The apparatus of any one of claims 5 through 7 further comprising indicating components responsive to said output signals for providing alarms to the user of the instrument.

20. An apparatus for determining the state of charge of a battery supplying electrical power to an instrument of the type which includes a current consuming component having at least two consumption levels, one of said levels being a minimum current consumption level defined as a minimum load and a second of said levels being a maximum consumption level defined as a maximum load, the apparatus comprising:

(a) means for periodically connecting said battery to a reference load when said current consuming component presents said minimum load to said battery;

(b) means for sampling the voltage across said reference load when said battery is connected to said reference load;

(c) means for comparing said sample voltage to a number of predetermined voltage levels each of which correspond to a different state of charge of said battery so as to determine the state of charge of said battery; and (d) means for generating at least one output signal which indicates the state of charge of said battery as determined by said comparing means, said reference load being selected to draw a current such that the current drawn from said battery by said reference load and said minimum load is approximately equal to the current drawn by said maximum load.

21. The apparatus of claim 20 further comprising means for converting said sampled voltage to a digital signal and means for providing a number of programmed digital signal to which said digital signal is compared.

22. The apparatus of claim 21 in which the means for converting the sampled voltage to digital form comprises:

(a) means for sampling and storing in analog form the voltage generated by the battery; and (b) an analog-to-digital converter for converting said sampled voltage to digital form.

* * * * *